(12) United States Patent
Codilian

(10) Patent No.: US 7,381,904 B1
(45) Date of Patent: Jun. 3, 2008

(54) DISK DRIVE PRINTED CIRCUIT BOARD WITH COMPONENT-DEDICATED ALIGNMENT LINE INDICATORS INCLUDING INNER AND OUTER LINE SEGMENTS

(75) Inventor: Raffi Codilian, Irvine, CA (US)

(73) Assignee: Western Digital Technologies, Inc., Lake Forest, CA (US)

(*) Notice: Subject to any disclaimer, the term of this patent is extended or adjusted under 35 U.S.C. 154(b) by 524 days.

(21) Appl. No.: 10/724,299

(22) Filed: Nov. 26, 2003

(51) Int. Cl.
*H05K 1/16* (2006.01)
(52) U.S. Cl. ................ 174/260; 361/760; 33/533
(58) Field of Classification Search ............... 174/260, 174/72 A, 256, 257, 261, 262, 265; 361/748–751, 361/792, 794, 803; 257/748, 764, 784, 797; 33/533, 613, 645
See application file for complete search history.

(56) References Cited

U.S. PATENT DOCUMENTS

| | | | |
|---|---|---|---|
| 5,065,092 A | * 11/1991 | Sigler | ................ 324/758 |
| 6,798,609 B1 | * 9/2004 | Bonin et al. | ............. 360/78.05 |
| 2002/0050397 A1 | * 5/2002 | Sakamoto et al. | .......... 174/250 |
| 2005/0013110 A1 | * 1/2005 | Shah et al. | |
| 2005/0117288 A1 | * 6/2005 | Spychalla | |

* cited by examiner

*Primary Examiner*—Jeremy C. Norris
*Assistant Examiner*—Yuriy Semenenko
(74) *Attorney, Agent, or Firm*—Kent A. Lambke, Esq.

(57) ABSTRACT

A printed circuit board on which multiple component-dedicated alignment line indicators including parallel lines may be used to facilitate the evaluation and segregation process during the production of printed circuit board assemblies based on the alignment characteristics of mounted disk drive electrical components with respect to these parallel lines. Each electrical component defines a perimeter with edges defining a first and second lateral distances and corners defining a diagonal distance. The alignment line indicators include first and second inner line segments spaced apart a first inner spacing at least the first lateral distance and less than the diagonal distance. The alignment line indicators include third and fourth inner line segments spaced apart at least the second lateral distance and less than the diagonal distance. The alignment line indicators include first and second outer line segments spaced apart more than the first inner spacing and less than the diagonal distance.

6 Claims, 5 Drawing Sheets

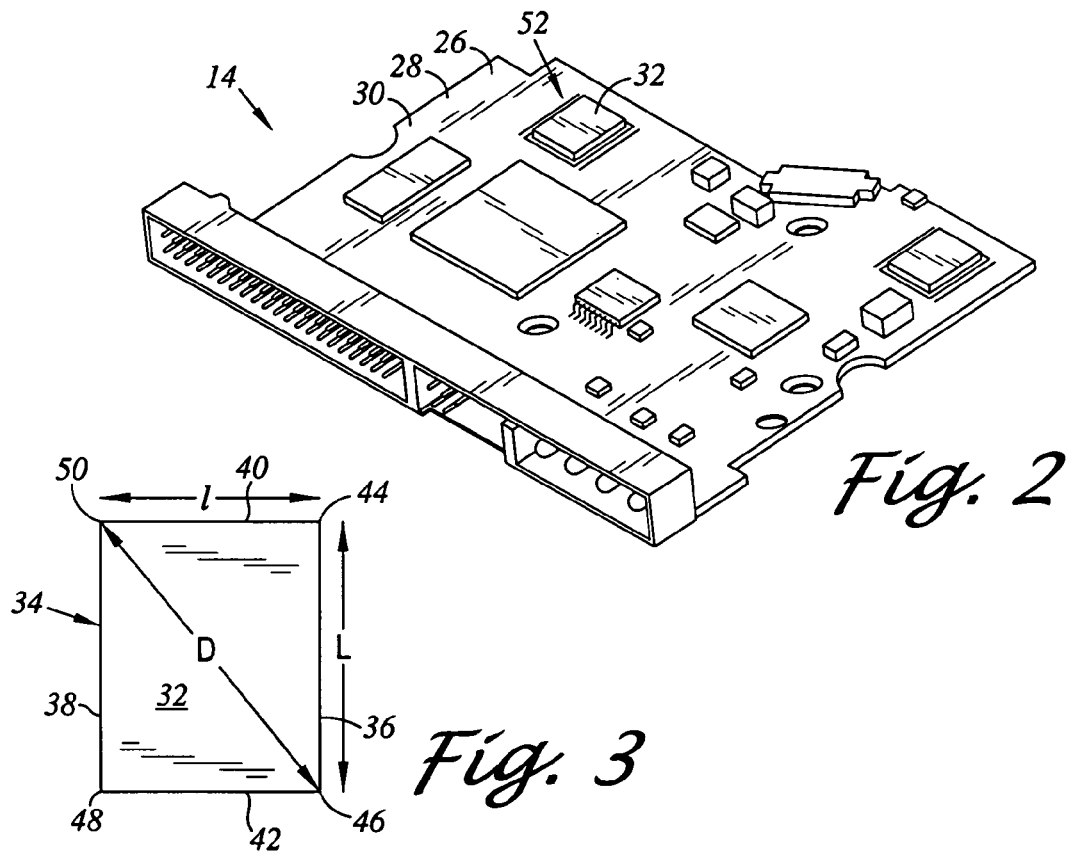
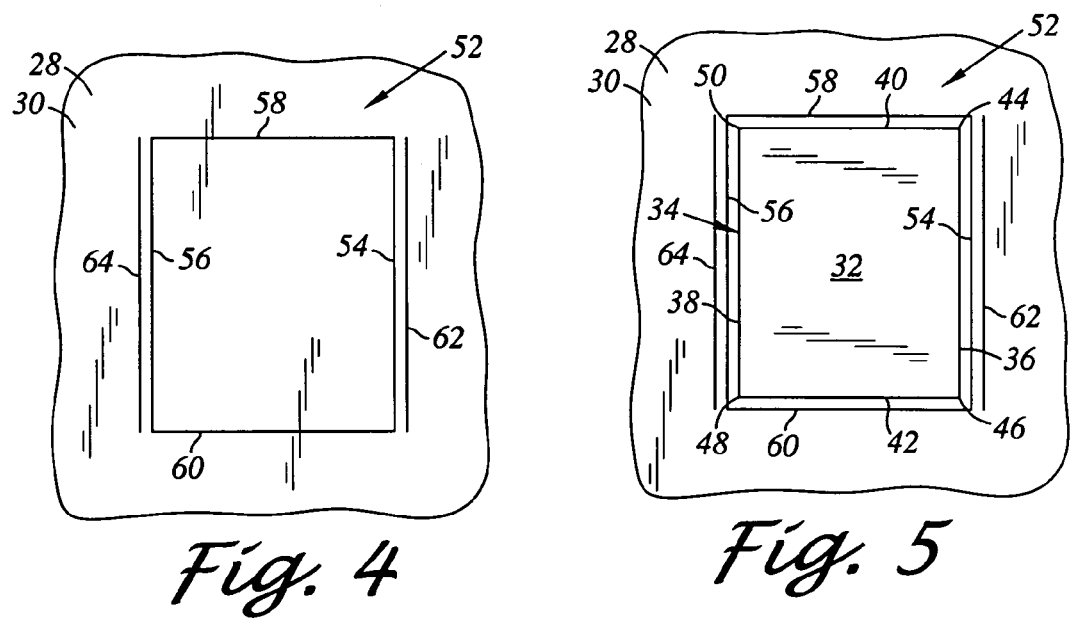

DISK DRIVE PRINTED CIRCUIT BOARD WITH COMPONENT-DEDICATED ALIGNMENT LINE INDICATORS INCLUDING INNER AND OUTER LINE SEGMENTS

BACKGROUND OF THE INVENTION

1. Field of the Invention

The present invention relates generally to disk drives, and in particular to a disk drive printed circuit board with component-dedicated alignment line indicators including inner and outer line segments and method of producing a printed circuit board assembly.

2. Description of the Prior Art

The typical hard disk drive includes a head disk assembly (HDA) and a printed circuit board assembly (PCBA) attached to a disk drive base of the HDA. The head disk assembly includes at least one magnetic disk, a spindle motor for rotating the disk, and a head stack assembly (HSA). The spindle motor includes a spindle motor hub that is rotatably attached to the disk drive base. The hub has an outer hub flange that supports a lowermost one of the disks. Additional disks may be stacked and separated with annular disk spacers that are disposed about the hub. The head stack assembly has an actuator assembly having at least one transducer head, typically several, for reading and writing data from and to the disk. The printed circuit board assembly includes a servo control system in the form of a disk controller for generating servo control signals mounted to a printed circuit board. The head stack assembly is controllably positioned in response to the generated servo control signals from the disk controller. In so doing, the attached heads are moved relative to tracks disposed upon the disk.

The head stack assembly includes an actuator assembly, at least one head gimbal assembly, and a flex circuit cable assembly. A conventional "rotary" or "swing-type" actuator assembly typically includes an actuator having an actuator body. The actuator body is configured to rotate on a pivot assembly between limited positions about an axis of rotation. A coil support extends from one side of the actuator body. A coil is supported by the coil support and is configured to interact with one or more permanent magnets to form a voice coil motor. One or more actuator arms extend from an opposite side of the actuator body.

A head gimbal assembly includes a transducer head, typically a magneto-resistive ("MR") head, which is distally attached to each of the actuator arms. To facilitate rotational movement of the actuator, the actuator assembly further includes the actuator body that has a bore and a pivot bearing cartridge engaged within the bore. Each magnetic disk includes opposing disk surfaces. Data may be recorded on a single surface or both along data annular regions. As such, the head stack assembly may be pivoted such that each transducer head is disposed adjacent the various data annular regions from adjacent the outer diameter to the inner diameter of each disk.

As can be appreciated, the reading and writing of data as facilitated by the controlled movement and positioning of the transducer heads is of critical importance. Various vibrations and forces, such as physical shock events, are of high interest. It may be desirable to precisely place some electrical components, such as sensors, on a printed circuit board. In this regard, the orientation accuracy of such components may be critical to their performance. Accelerometers mounted upon a printed circuit board may be used to determine rotational acceleration by computations involving differences between outputs of such accelerometers. Accordingly, there is a need in the art for a printed circuit board design and methodology for the alignment of components upon a printed circuit board in comparison to the prior art.

SUMMARY OF THE INVENTION

According to an aspect of the present invention, there is provided a disk drive printed circuit board for use with a disk drive electrical component. The disk drive electrical component defines a rectangular perimeter. The perimeter includes opposing first and second edges defining a first lateral distance. The perimeter further includes opposing third and fourth edges extending between the first and second edges and defining a second lateral distance. The perimeter further including opposing corners defining a diagonal distance. The printed circuit board includes a board body. The printed circuit board further includes a mounting surface disposed upon the board body. The printed circuit board further includes component-dedicated alignment line indicators visibly disposed at the mounting surface for aligning the disk drive electrical component at the mounting surface. The component-dedicated alignment line indicators include first and second inner line segments spaced apart a first inner spacing at least the first lateral distance and less than the diagonal distance. The component-dedicated alignment line indicators further include third and fourth inner line segments extending between and perpendicular to the first and second inner line segments. The third and fourth inner line segments are spaced apart a second inner spacing at least the second lateral distance and less than the diagonal distance. The component-dedicated alignment line indicators further include first and second outer line segments disposed parallel to the first and second inner line segments with the first and second inner line segments between the first and second outer line segments. The first and second outer line segments are spaced apart a first outer spacing more than the first inner spacing and less than the diagonal distance.

According to various embodiments, the third and fourth inner line segments may intersect the first and second inner line segments. The printed circuit board may further include a third outer line segment extending between and perpendicular to the first and second outer line segments. The third outer line segment is disposed with the third inner line segment between the third edge of the disk drive component and the third outer line segment. The third outer line segment may intersect the first and second outer line segments. The printed circuit board may further include the third outer line segment and a fourth outer line segment extending between and perpendicular to the first and second outer line segments. The third and fourth inner line segments spaced apart a second outer spacing at least the second lateral distance and less than the diagonal distance. The fourth outer line segment may also intersect the first and second outer line segments.

According to another aspect of the present invention, there is provided a method of producing printed circuit board assemblies. The method includes providing electrical components. Each of the electrical components defines a rectangular perimeter. The perimeter includes opposing first and second edges defining a first lateral distance. The perimeter further includes opposing third and fourth edges extending between the first and second edges and defining a second lateral distance. The perimeter further including opposing corners defining a diagonal distance. The method further includes providing printed circuit boards each including a board body, a mounting surface disposed upon the board body, and component-dedicated alignment line indicators visibly disposed at the mounting surface for aligning the disk drive electrical component at the mounting surface. The component-dedicated alignment line indicators include first and second inner line segments spaced apart a first inner spacing at least the first lateral distance and less than the diagonal distance. The component-dedicated alignment line indicators further include third and fourth inner line segments extending between and perpendicular to the first and second inner line segments, the third and fourth inner line segments spaced apart a second inner spacing at least the second lateral distance and less than the diagonal distance. The component-dedicated alignment line indicators further include first and second outer line segments disposed parallel to the first and second inner line segments with the first and second inner line segments between the first and second outer line segments. The first and second outer line segments spaced apart a first outer spacing more than the first inner spacing and less than the diagonal distance. The method further includes mounting the electrical components at the mounting surface of respective ones of the printed circuit boards adjacent the component-dedicated alignment line indicators to form candidate printed circuit board assemblies. The method further includes segregating the candidate printed circuit board assemblies based upon the position of the perimeters of the electrical components in relation to the component-dedicated alignment line indicators.

According to various embodiments, the method may include segregating given ones of the candidate printed circuit board assemblies based upon the perimeter of a respective one of the electrical components being disposed between the first and second inner lines segments and the third and fourth inner line segments. The method may include segregating given ones of the candidate printed circuit board assemblies based upon a respective one of the corners of the perimeter of a respective one of the electrical components being disposed beyond a respective one of the first and second inner line segments with respect to the first, second, third and fourth inner lines segments. The method may include segregating given ones of the candidate printed circuit board assemblies based upon a respective one of the corners of the perimeter of a respective one of the electrical components being disposed beyond a respective one of the third and fourth inner line segments with respect to the first, second, third and fourth inner lines segments.

Each of the perimeters of the electrical components may include a pair intermediate corners disposed between the opposing corners, and the method may further include segregating given ones of the candidate printed circuit board assemblies based upon a respective one of the opposing corners and a respective one of the intermediate corners both being disposed beyond a respective one of the first and second inner line segments with respect to the first, second, third and fourth inner lines segments. The method may further include segregating given ones of the candidate printed circuit board assemblies based upon a respective one of the opposing corners and a respective one of the intermediate corners both being disposed beyond a respective one of the third and fourth inner line segments with respect to the first, second, third and fourth inner lines segments.

The method may further include segregating given ones of the candidate printed circuit board assemblies based upon a respective one of the corners of the perimeter of a respective one of the electrical components being disposed beyond a respective one of the first and second outer line segments with respect to the first, second, third and fourth inner lines segments. The method may further includes segregating given ones of the candidate printed circuit board assemblies based upon a respective one of the opposing corners and a respective one of the intermediate corners both being disposed beyond a respective one of the first and second outer line segments with respect to the first, second, third and fourth inner lines segments. The printed circuit board assemblies may be for a disk drive and the electrical components may be accelerometers.

BRIEF DESCRIPTION OF THE DRAWINGS

FIG. 2 is an enlarged perspective view of the printed circuit board assembly of FIG. 1 including an electrical component and a printed circuit board with component-dedicated alignment line indicators;

FIG. 3 is a enlarged plan view of the electrical component of FIG. 2;

FIG. 4 is a enlarged plan view of a portion of the printed circuit board of FIG. 2 that contain the component-dedicated alignment line indicators;

FIG. 5 is the enlarged plan view of a portion of the printed circuit board as shown in FIG. 4 with the electrical component;

DESCRIPTION OF THE PREFERRED EMBODIMENTS

Figure 1:
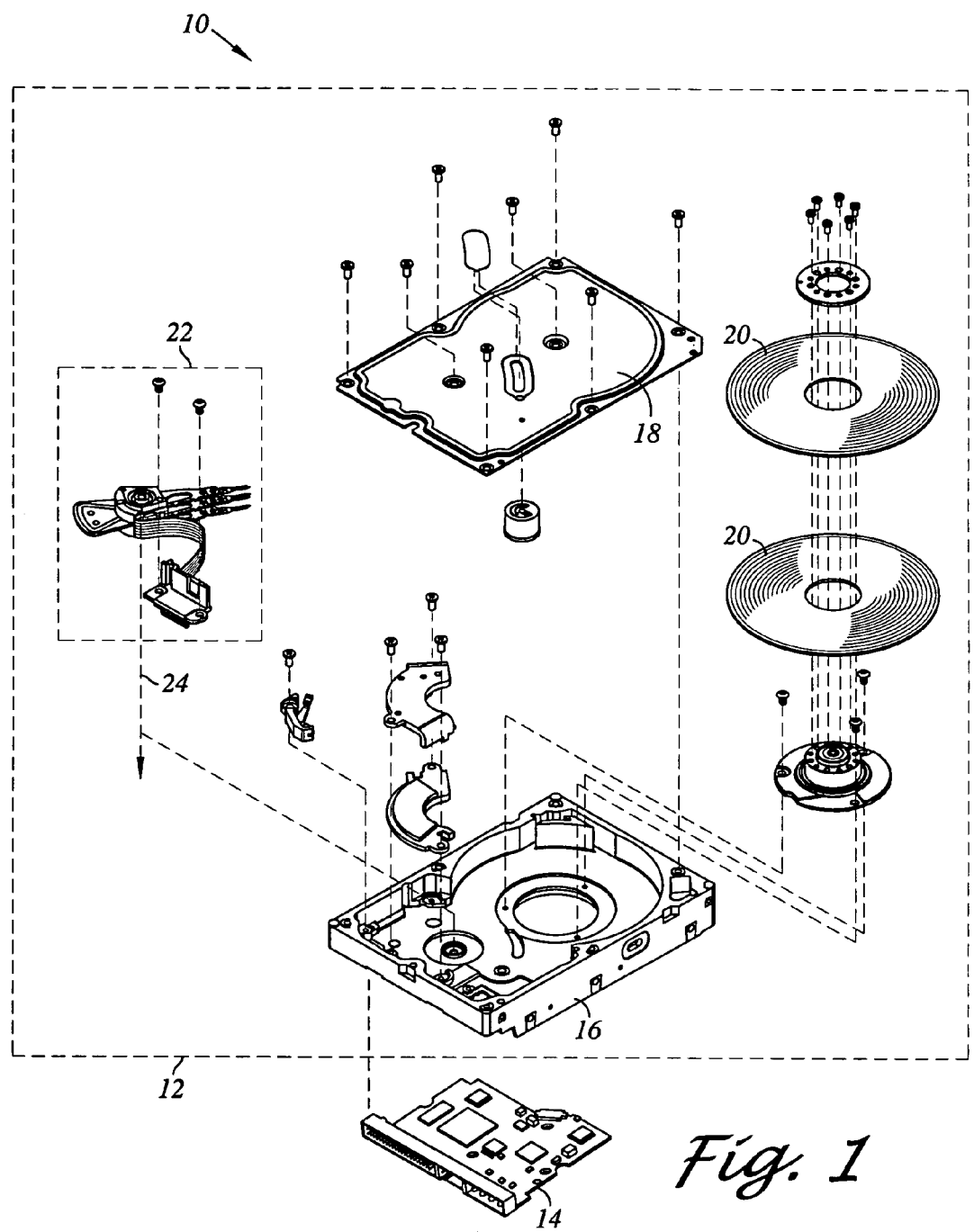
FIG. 1 is an exploded perspective view of a disk drive including a printed circuit board assembly in accordance with an aspect of the present invention.

Referring now to the drawings wherein the showings are for purposes of illustrating preferred embodiments of the present invention only, and not for purposes of limiting the same, FIGS. 1-13 illustrate a printed circuit board with component-dedicated alignment line indicators and a method of producing printed circuit board assemblies in accordance with aspects of the present invention.

Referring now to FIG. 1, there is depicted an exploded perspective view of a disk drive 10 as constructed in accordance with an aspect of the present invention. The disk drive 10 includes a head disk assembly (HDA) 12 and a printed circuit board assembly (PCBA) 14. The head disk assembly 12 includes a disk drive housing having disk drive housing members, such as a disk drive base 16 and a cover 18. The disk drive base 16 and the cover 18 collectively house at least one magnetic disk 20. Each disk 20 contains a plurality of tracks for storing data. The head disk assembly 12 further includes a spindle motor for rotating the disks 20. The head disk assembly 12 further includes a head stack assembly 22 rotatably attached to the disk drive base 16 in operable communication with the disk 20.

The head stack assembly 22 includes a rotary actuator with transducer heads. The head stack assembly 22 is configured to rotate between limited positions about an axis of rotation 24. Such movement allows the transducer head to read and write data from and to the disks 20. The head stack assembly 22 further includes a flex circuit assembly that carries signals between the transducer heads and the printed circuit board assembly 14.

Referring additionally to FIGS. 2 and 3, according to an aspect of the present invention, there is provided a disk drive printed circuit board 26 for use with a disk drive electrical component 32. The disk drive electrical component 32 defines a rectangular perimeter 34. As used herein a rectangular perimeter would include a square shape. The perimeter 34 includes opposing first and second edges 36, 38 defining a first lateral distance (l). The perimeter 34 further includes opposing third and fourth edges 40, 42 extending between the first and second 36, 38 edges and defining a second lateral distance (L). The perimeter 34 further includes opposing corners 46, 50 defining a diagonal distance (D). The perimeter 34 further includes opposing corners 44, 48 which are disposed between the opposing corners 46, 50.

The printed circuit board 26 includes a board body 28. The printed circuit board 26 further includes a mounting surface 30 disposed upon the board body 28. The printed circuit board 26 further includes component-dedicated alignment line indicators 52 visibly disposed at the mounting surface 30 for aligning the disk drive electrical component 32 at the mounting surface 32. The component-dedicated alignment line indicators 52 include first and second inner line segments 54, 56 spaced apart a first inner spacing at least the first lateral distance (l) and less than the diagonal distance (D). The component-dedicated alignment line indicators 52 further include third and fourth inner line segments 58, 60 extending between and perpendicular to the first and second inner line segments 54, 56. The third and fourth inner line segments 58, 60 are spaced apart a second inner spacing at least the second lateral distance (L) and less than the diagonal distance (D). The component-dedicated alignment line indicators 52 further include first and second outer line segments 62, 64 disposed parallel to the first and second inner line segments 54, 56 with the first and second inner line segments 54, 56 between the first and second outer line segments 62, 64. The first and second outer line segments 62, 64 are spaced apart a first outer spacing more than the first inner spacing and less than the diagonal distance (D).

As used herein, the term component-dedicated referred to a one to one correspondence of the alignment line indicators 52 as a group as designed to have a given electrical component 32 disposed adjacent thereto. Thus for example, merely having a uniformly meshed grid imprinted about the mounting surface 30 would not be considered to be "component-dedicated".

According to various embodiments, the component-dedicated alignment line indicators 52 may be silk screened upon the mounting surface 30 of the printed circuit board 26. The first and second inner line segments 54, 56 may be formed to interest the first and fourth inner line segments 58, 60. As shown FIG. 5 for example, the first, second, third and fourth inner line segments 54, 56, 58, 60 may be formed into a rectangle of a size so as to circumscribe the electrical component 32 when centered adjacent the component-dedicated alignment line indicators 52.

Figure 12:
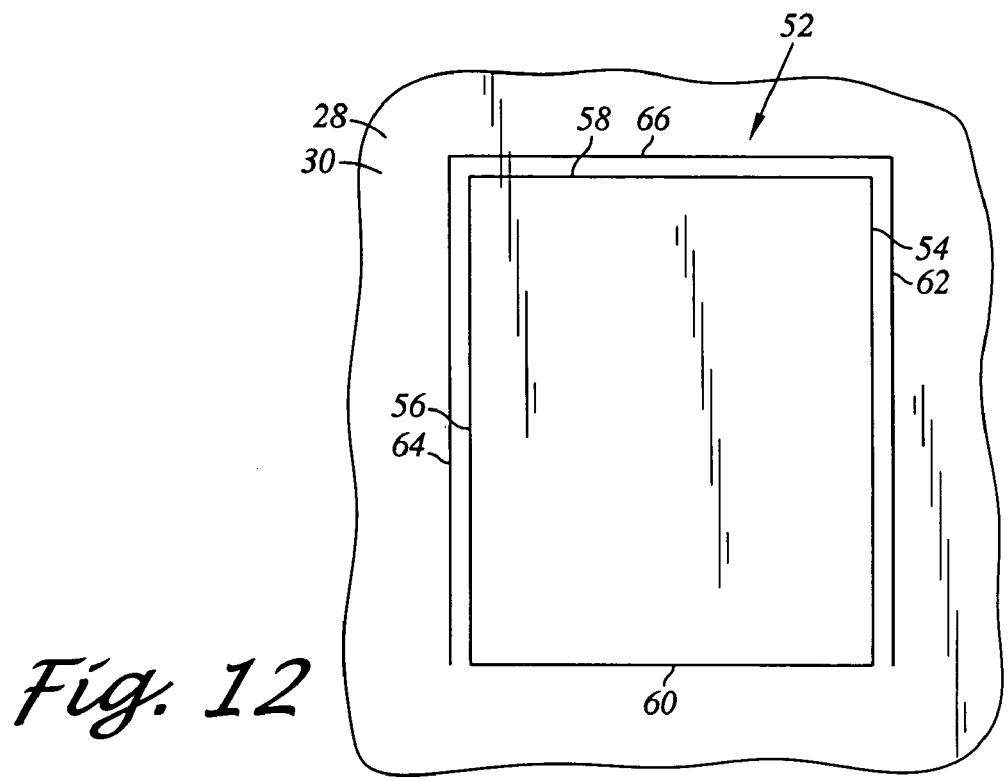
FIG. 12 is the enlarged plan view of a portion of the printed circuit board similar to that of FIG. 4, however, with an alignment line configuration according to another embodiment.

Referring to FIG. 12, there is depicted another embodiment. In this embodiment, the alignment line indicators 52 further include a third outer line segment 66 extending between and perpendicular to the first and second outer line segments 62, 64. The third outer line segment 66 is disposed with the third inner line segment 58 between the third edge 40 of the disk drive component and the third outer line segment 66. The third outer line segment 66 may intersect the first and second outer line segments 62, 64.

Figure 13:
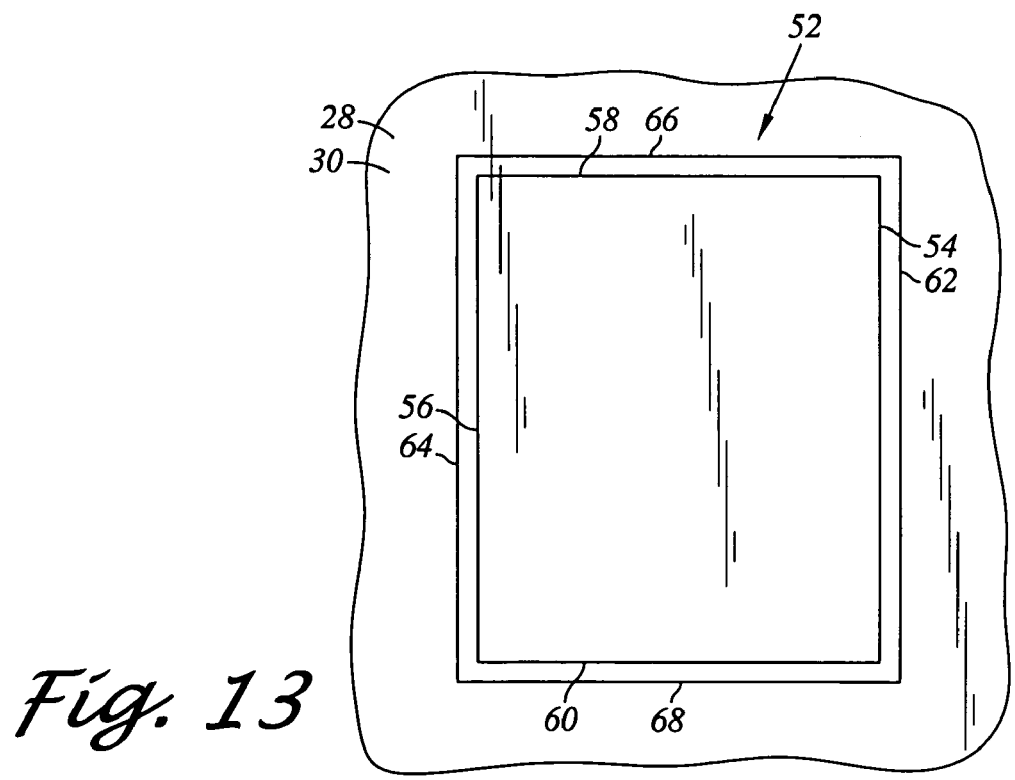
FIG. 13 is the enlarged plan view of a portion of the printed circuit board similar to that of FIG. 4, however, with an alignment line configuration according to another embodiment.

Referring to FIG. 13, there is depicted another embodiment. In this embodiment, the alignment line indicators 52 further include a fourth outer line segment 68 between and perpendicular to the first and second outer line segments 62, 64. The third and fourth outer line segments 66, 68 are spaced apart a second outer spacing at least the second lateral distance (L) and less than the diagonal distance (D). The fourth outer line segment 68 intersects the first and second outer line segments 62, 64.

Having thus described various configurations and requirements of the component-dedicated alignment line indicators 52, the significance of such requirements will be appreciated in the context of the methodology of producing printed circuit board assemblies 14 as further discussed below.

According to another aspect of the present invention, there is provided a method of producing printed circuit board assemblies 14. The method includes providing electrical components similar to the electrical component 34 described above. The method further includes providing printed circuit boards 26. Each of the printed circuit boards 26 are as described above and include the component-dedicated alignment line indicators 52. The method further includes mounting the electrical components 32 at the mounting surface 30 of respective ones of the printed circuit boards 26 adjacent the component-dedicated alignment line indicators 52 to form candidate printed circuit board assemblies 14. The method further includes segregating the candidate printed circuit board assemblies 14 based upon the position of the perimeters 34 of the electrical components 32 in relation to the component-dedicated alignment line indicators 52.

According to various embodiments, referring to FIG. 5, the method may include segregating given ones of the candidate printed circuit board assemblies 14 based upon the perimeter 34 of a respective one of the electrical components being disposed between the first and second inner lines segments 54, 56 and the third and fourth inner line segments 58, 60. Such an alignment of the electrical components 32 could signify proper installation of the electrical components 32 both in terms of translational positioning and rotational positioning upon the printed circuit board 26. The particular spacing of the various component-dedicated alignment line indicators 52 may correspond to translational and rotational positioning error specifications.

The method may include segregating given ones of the candidate printed circuit board assemblies 14 based upon a respective one of the corners 44, 46, 48, 50 of the perimeter 34 of a respective one of the electrical components 32 being disposed beyond a respective one of the first, second, third and fourth inner line segments 54, 56, 58, 60 with respect to the first, second, third and fourth inner lines segments 54, 56, 58, 60, examples of which are shown in FIGS. 6-9 and discussed below.

Figure 6:
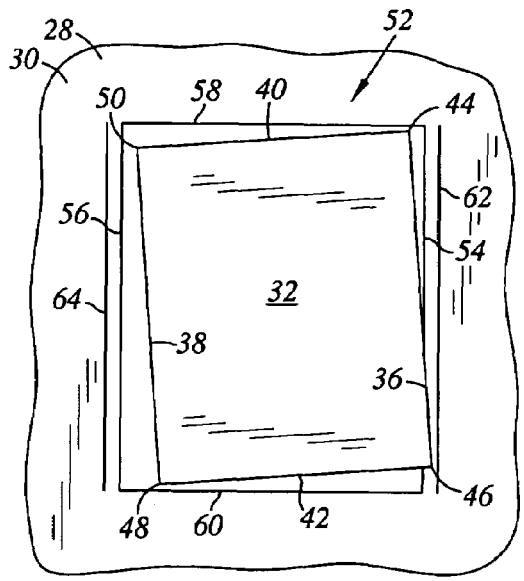
FIG. 6 is the enlarged plan view of a portion of the printed circuit board as shown in FIG. 4 with the electrical component being misaligned.

Referring to FIG. 6, the corner 46 is shown as being disposed beyond the first inner line segment 54 with respect to the first, second, third and fourth inner line segments 54, 56, 58, 60. The other corners 44, 48, 50 are not extended beyond any of the first, second, third or fourth inner line segments 54, 56, 58, 60. In addition, the corner 46 is not contacting or touching the first outer line segment 62. Such a configuration may be indicative of the candidate printed circuit board assembly 14 having failing rotational positioning while nonetheless having an acceptable translational positioning in terms of the applicable error specification for the electrical component 32. The may be the case where rotational positioning is critical, such as where the printed circuit board assemblies 14 are for a disk drive 10 and the electrical components 32 are accelerometers.

Figure 7:
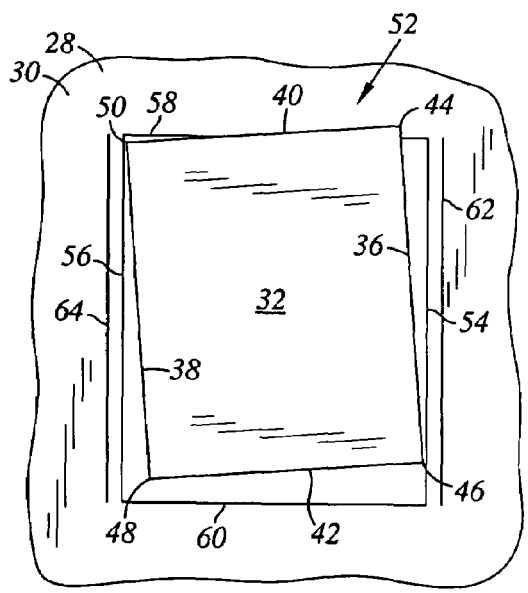
FIG. 7 is the enlarged plan view of a portion of the printed circuit board as shown in FIG. 4 with the electrical component being misaligned.

Referring to FIG. 7, the corner 44 is shown as being disposed beyond the third inner line segment 58 with respect to the first, second, third and fourth inner line segments 54, 56, 58, 60. The corners 46, 48, 50 are not extended beyond any of the first, second, third or fourth inner line segments 54, 56, 58, 60. Such a configuration may be indicative of the candidate printed circuit board assembly 14 having failing rotational positioning while nonetheless having an acceptable translational positioning in terms of the applicable error specification for the electrical component 32.

Figure 8:
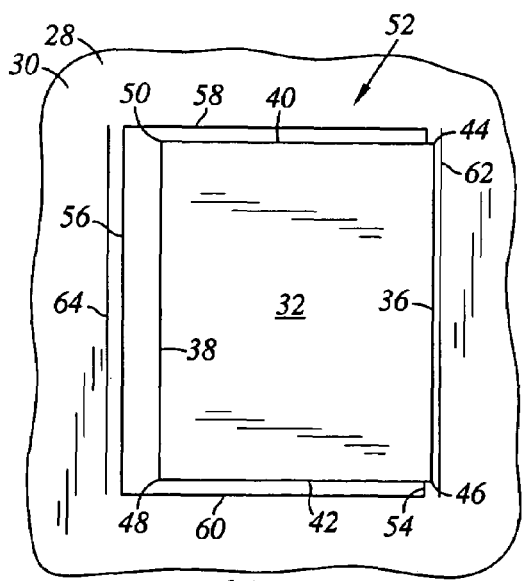
FIG. 8 is the enlarged plan view of a portion of the printed circuit board as shown in FIG. 4 with the electrical component being misaligned.

Referring to FIG. 8, the corners 44, 46 are shown as being disposed beyond the first inner line segment 54 with respect to the first, second, third and fourth inner line segments 54, 56, 58, 60. The corners 48, 50 are not extended beyond any of the first, second, third or fourth inner line segments 54, 56, 58, 60. In addition the corners 44, 46 are not extended beyond the first outer line segment 62. In this regard, the first edge 36 is between the first inner line segments 54 and the first outer line segment 62. Such a configuration may be indicative of the candidate printed circuit board assembly 14 having an acceptable rotational positioning (i.e., within the angle formed between the location on first outer line segment 62 adjacent the fourth inner line segment 60 and the location on the first inner line segment 54 at the third inner line segment 58) and an acceptable translational positioning (i.e., within the distance of the first inner line segment 54 and the first outer line segment 62) in terms of the applicable error specification for the electrical component 32. This is advantageous in comparison to a prior art configuration consisting of only lines similar to the first, second, third and fourth inner line segments 54, 56, 58, 60. This is because such a prior art configuration would only allow for an unacceptable outcome for the positioning of the electrical component 32 when the component 32 is placed outside of the first, second, third, and fourth inner line segments 54, 56, 58, 60. Whereas the utilization of the first and second outer line segments 62, 68 allow for a higher degree of differentiation between translational and rotational positioning errors. Stated otherwise, the utilization of the first and second outer line segments 62, 68 for a bounded determination of how far translated outside of the rectangle formed by the first, second, third and fourth inner line segments 54, 56, 58, 60 and how much rotated)

Figure 9:
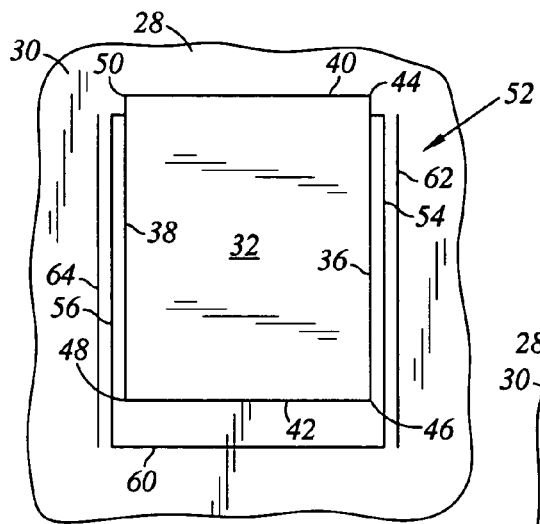
FIG. 9 is the enlarged plan view of a portion of the printed circuit board as shown in FIG. 4 with the electrical component being misaligned.

Referring to FIG. 9, the corners 44, 50 are shown as being disposed beyond the third inner line segment 58 with respect to the first, second, third and fourth inner line segments 54, 56, 58, 60. The corners 46, 48 are not extended beyond any of the first, second, third or fourth inner line segments 54, 56, 58, 60. Such a configuration may be indicative of the candidate printed circuit board assembly 14 having an acceptable rotational positioning and may be or may be not having an acceptable translational positioning in terms of the applicable error specification for the electrical component 32.

In addition, the method may include segregating given ones of the candidate printed circuit board assemblies 14 based upon a respective one of the corners 44, 46, 48, 50 of the perimeter 34 of a respective one of the electrical components 32 being disposed beyond a respective one of the first and second outer line segments 62, 64 with respect to the first, second, third, and fourth inner line segments 54, 56, 58, 60.

Figure 10:
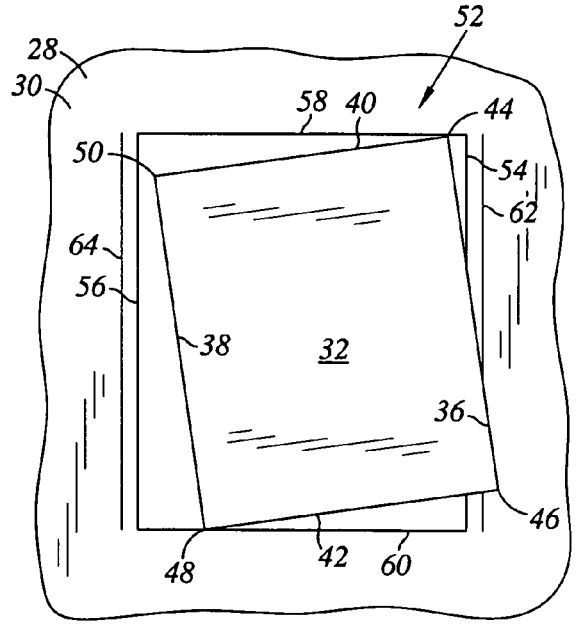
FIG. 10 is the enlarged plan view of a portion of the printed circuit board as shown in FIG. 4 with the electrical component being misaligned.

Referring now to FIG. 10, the corner 46 may be disposed beyond the first outer line segment 62 with respect to the first, second, third, and fourth inner line segments 54, 56, 58, 60. The remaining corners 44, 48, 50 do not extend beyond the first, second, third, and fourth inner line segments 54, 56, 58, 60. Such a configuration may be indicative of the candidate printed circuit board assembly 14 having an unacceptable rotational positioning in terms of the applicable error specification for the electrical component 32.

Figure 11:
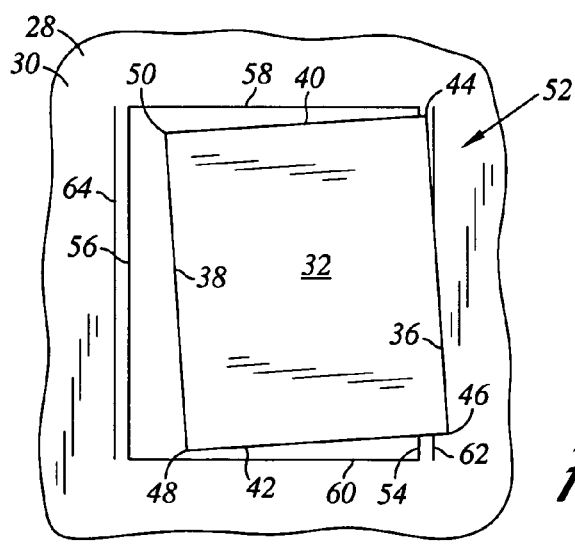
FIG. 11 is the enlarged plan view of a portion of the printed circuit board as shown in FIG. 4 with the electrical component being misaligned.

Referring now to FIG. 11, the corner 46 may be disposed beyond the first outer line segment 62 with respect to the first, second, third, and fourth inner line segments 54, 56, 58, 60. The corner 44 may be disposed beyond the first inner line segment 54 with respect to the first, second, third, and fourth inner line segments 54, 56, 58, 60. The remaining corners 48, 50 do not extend beyond the first, second, third, and fourth inner line segments 54, 56, 58, 60. Such a configuration may or may not be indicative of the candidate printed circuit board assembly 14 having an acceptable rotational and transitional positioning in terms of the applicable error specification for the electrical component 32.

Similar segregation criteria of the candidate printed circuit board assemblies 14 may be utilized in relation to the third and fourth outer line segments 66, 68 shown in FIGS. 12 and 13.

I claim:

1. A disk drive printed circuit board for use with a disk drive electrical component, the disk drive electrical component defining a rectangular perimeter, the perimeter including opposing first and second edges spaced apart a first lateral distance, the perimeter further including opposing third and fourth edges extending between the first and second edges and spaced apart a second lateral distance, the perimeter further including opposing corners spaced apart a diagonal distance, the printed circuit board comprising:
   a board body;
   a mounting surface disposed upon the board body; and
   component-dedicated alignment line indicators disposed on the mounting surface for visibly aligning the disk drive electrical component on the mounting surface, the component-dedicated alignment line indicators including:
      first and second inner line segments spaced apart a first inner spacing at least the first lateral distance and less than the diagonal distance;
      third and fourth inner line segments extending between and perpendicular to the first and second inner line segments, the third and fourth inner line segments spaced apart a second inner spacing at least the second lateral distance and less than the diagonal distance; and first and second outer line segments disposed parallel to the first and second inner line segments with the first and second inner line segments between the first and second outer line segments, the first and second outer line segments spaced apart a first outer spacing more than the first inner spacing and less than the diagonal distance.

2. The printed circuit board of claim 1 wherein the third and fourth inner line segments intersect the first and second inner line segments.

3. The printed circuit board of claim 1 wherein the component-dedicated alignment line indicators further includes a third outer line segment extending between and perpendicular to the first and second outer line segments, the third outer line segment is disposed with the third inner line segment between the third edge of the disk drive component and the third outer line segment.

4. The printed circuit board of claim 3 wherein the third outer line segment intersects the first and second outer line segments.

5. The printed circuit board of claim 1 wherein the component-dedicated alignment line indicators further includes third and fourth outer line segments extending between and perpendicular to the first and second outer line segments, the third and fourth inner line segments spaced apart a second outer spacing at least the second lateral distance and less than the diagonal distance.

6. The printed circuit board of claim 5 wherein the third and fourth outer line segments intersect the first and second outer line segments.

* * * * *